United States Patent
Veluppillai et al.

(10) Patent No.: US 9,112,461 B2
(45) Date of Patent: Aug. 18, 2015

(54) METHOD AND APPARATUS FOR ANTENNA PARAMETER NOTIFICATION

(75) Inventors: Mahinthan Veluppillai, Kitchener (CA); Nagula Tharma Sangary, Waterloo (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 445 days.

(21) Appl. No.: 13/541,701

(22) Filed: Jul. 4, 2012

(65) Prior Publication Data
US 2014/0010376 A1 Jan. 9, 2014

(51) Int. Cl.
*H03G 3/20* (2006.01)
*H03G 1/00* (2006.01)
*H03G 3/04* (2006.01)

(52) U.S. Cl.
CPC ... *H03G 1/00* (2013.01); *H03G 3/04* (2013.01)

(58) Field of Classification Search
CPC .................................................. H03G 3/32
USPC .......................................... 381/57; 455/566
See application file for complete search history.

(56) References Cited

U.S. PATENT DOCUMENTS

| | | | |
|---|---|---|---|
| 5,903,237 A | 5/1999 | Crosby et al. | |
| 7,065,324 B2 | 6/2006 | Mee et al. | |
| 7,292,178 B1 | 11/2007 | Woodell et al. | |
| 7,733,968 B2 | 6/2010 | Ling et al. | |
| 2003/0162558 A1 | 8/2003 | Takase et al. | |
| 2003/0223947 A1 | 12/2003 | Alvarez | |
| 2004/0121742 A1* | 6/2004 | Abrams et al. | 455/115.1 |
| 2008/0132283 A1* | 6/2008 | Ponce De Leon et al. | 455/566 |
| 2009/0066666 A1 | 3/2009 | Sagou | |
| 2011/0159920 A1* | 6/2011 | Lehmann | 455/556.1 |
| 2013/0265202 A1* | 10/2013 | Soora | 343/700 MS |
| 2014/0128032 A1* | 5/2014 | Muthukumar | 455/411 |

FOREIGN PATENT DOCUMENTS

| | | |
|---|---|---|
| EP | 2157770 A1 | 2/2010 |
| WO | 2009/101618 A1 | 8/2009 |

OTHER PUBLICATIONS

Corresponding European Patent Application No. EP 12174987.3 Search Report dated Dec. 20, 2012; Examiner: Moumen, Abderrahim.
Related European Patent Application No. EP 12174989.9 Search Report dated Dec. 20. 2012; Examiner: Moumen, Abderrahim.
Non-Final Rejection dated Dec. 26, 2014, issued on Corresponding U.S. Appl. No. 13/541,704.

* cited by examiner

*Primary Examiner* — Simon King
(74) *Attorney, Agent, or Firm* — Perry + Currier, Inc.

(57) ABSTRACT

A method and apparatus for antenna parameter notification is provided. At a device comprising: at least one processor, an antenna, a proximity sensor and a speaker, a parameter associated with performance of the antenna is determined by the processor. When the parameter meets a given criteria, and when the proximity sensor detects proximity, then the processor changes audio of sound played at the speaker.

17 Claims, 7 Drawing Sheets

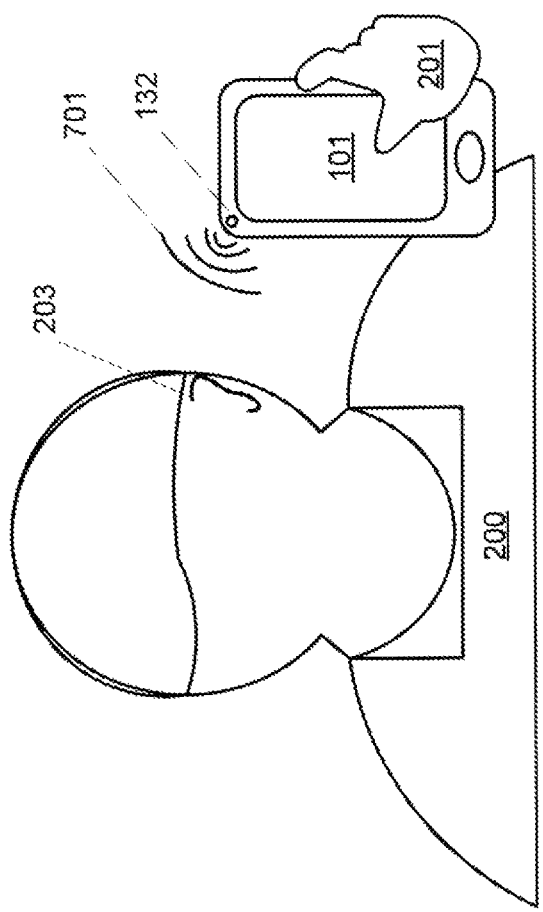

METHOD AND APPARATUS FOR ANTENNA PARAMETER NOTIFICATION

FIELD

The specification relates generally to antennas, and specifically to a method and apparatus for antenna parameter notification.

BACKGROUND

Mobile devices are generally trending towards being slimmer (and possibly flexible), with MIMO (multiple-in-multiple-out) antennas. In such mobile devices, tuneable antennas and adaptive impedance matching techniques are important. However, for some cases, such dynamic techniques do not provide optimized radio performance. For example, device orientation, device shape, slider and/or flip position, hand position, interference between multiple radios, SAR (specific absorption rate) requirements and the like, all affect antenna performance due to resulting changes in coupling, out of tuning range, and the like.

BRIEF DESCRIPTIONS OF THE DRAWINGS

For a better understanding of the various implementations described herein and to show more clearly how they may be carried into effect, reference will now be made, by way of example only, to the accompanying drawings in which:

FIG. 7 depicts a perspective view of the device of FIG. 1 with the volume of a speaker being increased, according to non-limiting implementations.

DETAILED DESCRIPTION

Figure 1:
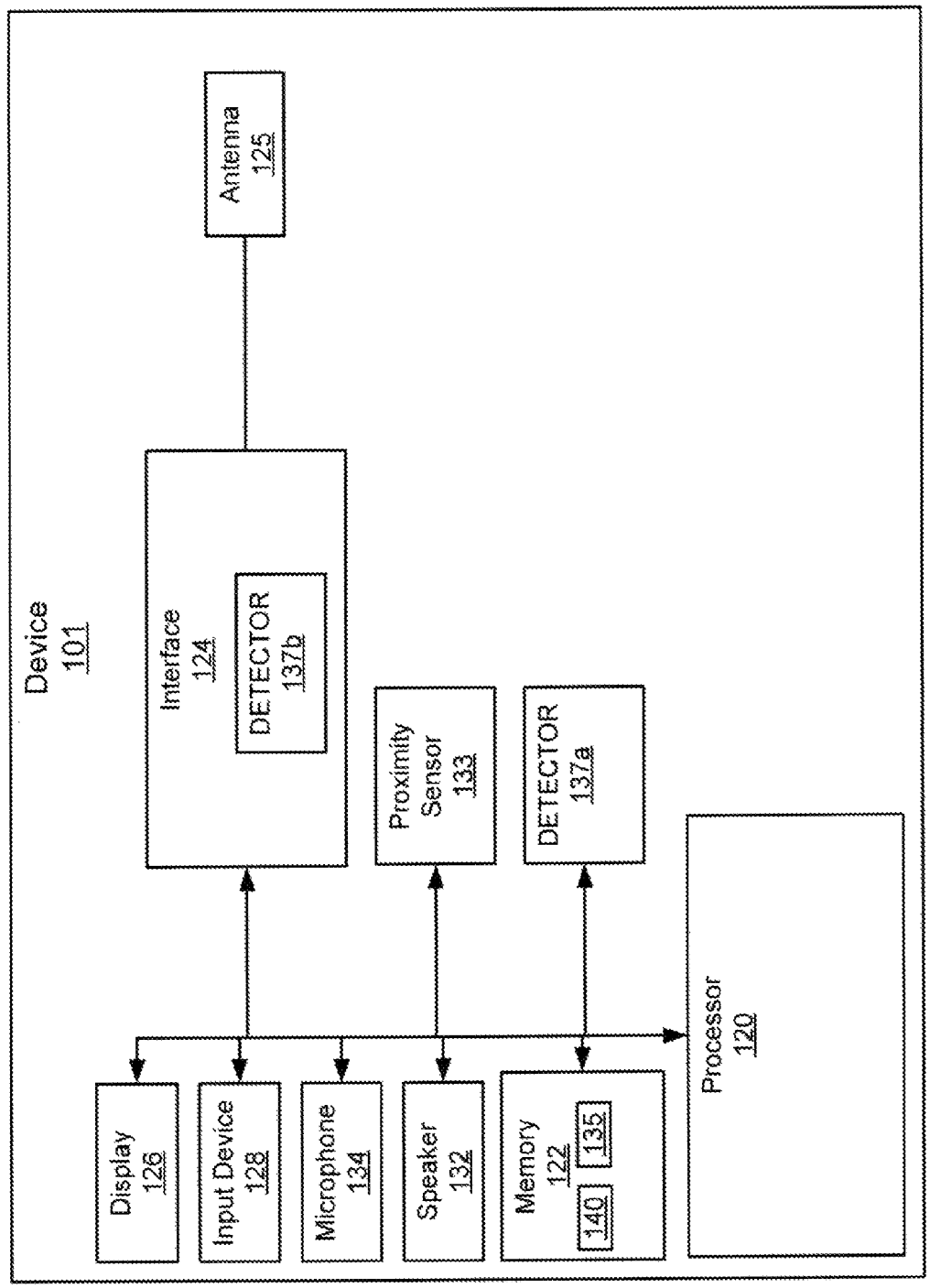
FIG. 1 depicts a schematic diagram of device for antenna parameter notification, according to non-limiting implementations.

A first aspect of the specification provides a device comprising: at least one processor, an antenna, a proximity sensor and a speaker, the at least one processor enabled to: determine a parameter associated with performance of the antenna; and, when the parameter meets a given criteria, and when the proximity sensor detects proximity; then change audio of sound played at the speaker.

The parameter can comprise a SAR (specific absorption rate) level, and the given criteria can comprise the SAR level exceeding a threshold SAR level.

The parameter can comprise an impedance of the antenna, and the given criteria can comprise the impedance being out of a given range thereby indicating impedance mismatch between the antenna and associated radio equipment.

The parameter can comprise voice quality provided at the speaker, and the given criteria can comprise the voice quality being below a given voice quality threshold level.

The proximity sensor can comprise one or more of an IR (infrared) diode/detector combination, a capacitive sensor, a capacitive displacement sensor, a Doppler effect sensor, a laser sensor, an optical sensor, an acoustic sensor, a passive optical sensor, a charge-coupled device, a passive thermal infrared sensor, a photocell sensor a magnetometer, a gyroscope, an accelerometer, and an altimeter.

The proximity sensor can be located adjacent the speaker, such that the proximity sensor can sense a head-hand mode of the device.

The audio of the sound played at the speaker can be changed to a given volume predetermined to cause discomfort to a human being when the speaker is adjacent an ear of the human being.

The processor can be further enabled to change a volume of the speaker as a function of the parameter, such that change in the volume of the speaker varies according to the parameter.

The processor can be further enabled to change one or more of a tone and a message played at the speaker as a function of the parameter, such that change in the one or more of the tone and the message varies according to the parameter.

The processor can be further enabled to monitor the parameter and change the audio of the sound played at the speaker in a feedback loop with the parameter.

At least a portion of the device can be flexible and the processor can be further enabled to change the audio of the sound played at the speaker as a shape of the device changes.

Another aspect of the specification comprises a method comprising: at a device comprising at least one processor, an antenna, a proximity sensor and a speaker, determining, at the processor, a parameter associated with performance of the antenna; and, when the parameter meets a given criteria, and when the proximity sensor detects proximity, then changing audio of sound played at the speaker.

The parameter can comprise a SAR (specific absorption rate) level, and the given criteria can comprise the SAR level exceeding a threshold SAR level.

The parameter can comprise an impedance of the antenna, and the given criteria can comprise the impedance being out of a given range thereby indicating impedance mismatch between the antenna and associated radio equipment.

The parameter can comprise voice quality provided at the speaker, and the given criteria can comprise the voice quality being below a given voice quality threshold level.

The audio of the sound played at the speaker can be changed to a given volume predetermined to cause discomfort to a human being when the speaker is adjacent an ear of the human being.

The method can further comprise changing a volume of the speaker as a function of the parameter, such that change in the volume of the speaker varies according to the parameter.

The method can further comprise changing one or more of a tone and a message played at the speaker as a function of the parameter, such that change in the one or more of the tone and the message varies according to the parameter.

The method can further comprise monitoring the parameter and changing the audio of the sound played at the speaker in a feedback loop with the parameter.

At least a portion of the device can be flexible and the method can further comprise changing the audio of the sound played at the speaker as a shape of the device changes.

Yet another aspect of the specification provides a computer program product, comprising a computer usable medium having a computer readable program code adapted to be executed to implement a method comprising: at a device comprising at least one processor, an antenna, a proximity sensor and a speaker, determining, at the processor, a parameter associated with performance of the antenna; and, when the parameter meets a given criteria, and when the proximity sensor detects proximity, then changing audio of sound played at the speaker. The computer program product can be non-transitory.

FIG. 1 depicts a schematic diagram of a device 101 for antenna parameter notification, according to non-limiting implementations. Device 101 comprises a processor 120 interconnected with a memory 122, a communications interface 124, an antenna 125, a display 126, an input device 128, a speaker 132, at least one proximity sensor 133, and a microphone 134. Communications interface 124 will be interchangeably referred to as interface 124. As will be presently explained, processor 120 is generally enabled for antenna parameter notification; specifically, processor 120 is enabled to: determine a parameter associated with performance of antenna 125; and, when the parameter meets a given criteria 135, stored at memory 122, and when at least one proximity sensor 133 determines proximity, then change an audio of sound played at speaker 132.

It is yet further appreciated that changing a the audio of sound played at speaker 132 can comprise controlling an electrical property of speaker 132, including but not limited to one or more of a voltage and a current.

Device 101 can be any type of electronic device that can be used in a self-contained manner to communicate with one or more communication networks using antenna 125. Device 101 includes, but is not limited to, any suitable combination of electronic devices, communications devices, computing devices, personal computers, laptop computers, portable electronic devices, mobile computing devices, portable computing devices, tablet computing devices, laptop computing devices, desktop phones, telephones, PDAs (personal digital assistants), cellphones, smartphones, e-readers, internet-enabled appliances and the like. Other suitable devices are within the scope of present implementations.

Figure 2:
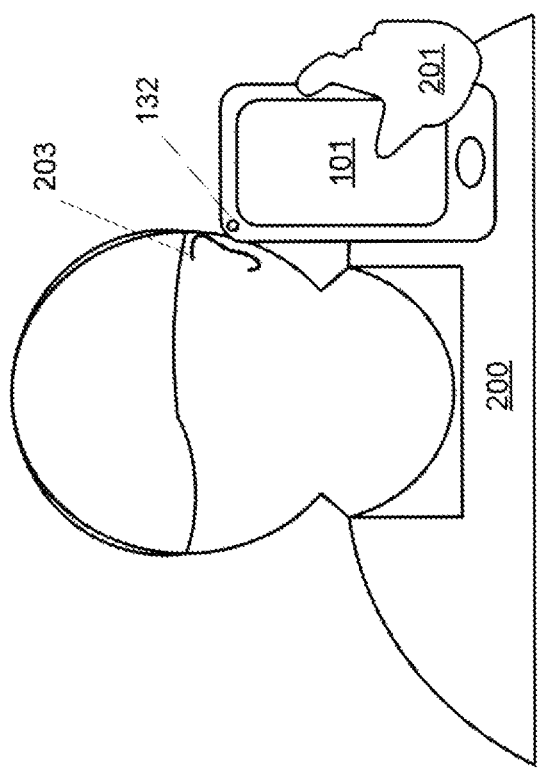
FIG. 2 depicts a perspective view of the device of FIG. 1 in use, according to non-limiting implementations.

However, it is appreciated that, regardless of the configuration of device 101, device 101 is generally enabled for a hand-head mode such that least speaker 132 can be held to an ear of a user when device 101 is being used as a telephony device. For example, attention is directed to FIG. 2, which depicts a perspective view of device 101 being placed adjacent an ear of a user 200; for example, user 200 holds device 101 in his/her hand 201 and holds device 101 to his/her ear 203 such that sound from speaker 132 is directed into ear 203. It is further appreciated that, while in FIG. 2 speaker 132 is depicted at a corner of device 101, speaker 132 can be located at any suitable position on device 101. Indeed, it is appreciates that speaker 132 can be located at an upper rim of device 101 such that device 101 can be held against a cheek of user 200 with speaker 132 located on device 101 such that sound from speaker is directed into ear 203. Microphone 134 is hence suitably placed to receive sound when user 200 speaks to accordingly conduct a telephone call.

Attention is now directed back to FIG. 1: it should be emphasized that the structure of device 101 in FIG. 1 is purely an example, and contemplates a device that can be used for both wireless voice (e.g. telephony) and wireless data communications (e.g. email, web browsing, text, and the like). However, while FIG. 1 contemplates a device that can be used for telephony, in other implementations, device 101 can comprise a device enabled for implementing any other suitable specialized functions, including, but not limited, to one or more of, computing, appliance, and/or entertainment related functions.

Device 101 comprises at least one input device 128 generally enabled to receive input data, and can comprise any suitable combination of input devices, including but not limited to a keyboard, a keypad, a pointing device, a mouse, a track wheel, a trackball, a touchpad, a touch screen and the like. Other suitable input devices are within the scope of present implementations.

Input from input device 128 is received at processor 120 (which can be implemented as a plurality of processors, including but not limited to one or more central processors (CPUs)). Processor 120 is configured to communicate with a memory 122 comprising a non-volatile storage unit (e.g. Erasable Electronic Programmable Read Only Memory ("EEPROM"), Flash Memory) and a volatile storage unit (e.g. random access memory ("RAM")). Programming instructions that implement the functional teachings of device 101 as described herein are typically maintained, persistently, in memory 122 and used by processor 120 which makes appropriate utilization of volatile storage during the execution of such programming instructions. Those skilled in the art will now recognize that memory 122 is an example of computer readable media that can store programming instructions executable on processor 120. Furthermore, memory 122 is also an example of a memory unit and/or memory module.

In particular, it is appreciated that memory 122 stores an application 140 that, when processed by processor 120, enables processor 120 to: determine a parameter associated with performance of antenna 125; and, when the parameter meets given criteria 135, and when proximity sensor 133 determines proximity, then change audio of sound played at speaker 132. For example, the volume level of speaker 132 can be increased or decreased. In some implementations, the volume of speaker 132 is changed to a given volume level stored at memory 122. In some of these implementations, the volume of speaker 132 is increased to a given volume level stored at memory 122 that has been predetermined to cause discomfort to a human being when the speaker is adjacent an ear of a human being. Since the human ear does not have a flat spectral response, in some of these implementations, the given volume level can depend on a frequency range of sound being played at speaker 132 when the volume level is increased, such that frequency ranges that are predetermined to cause most discomfort in a human being are raised to the given volume level, for example in a lower frequency range of about 20 hz to about 150 hz and/or in the higher frequency range of about 1000 Hz to about 20 kHz. However any suitable range of frequencies audible to human beings are within the scope of present implementations.

In yet other implementations, the audio of sound played at speaker 132 can be changed by changing one or more of a tone and a message at the speaker 132.

Processor 120 can be further configured to communicate with display 126, and microphone 134 and speaker 132. Display 126 comprises any suitable one of, or combination of, CRT (cathode ray tube) and/or flat panel displays (e.g. LCD (liquid crystal display), plasma, OLED (organic light emitting diode), capacitive or resistive touchscreens, and the like). Microphone 134, comprises any suitable microphone for receiving sound data.

Speaker 132 comprises any suitable speaker for providing sound data, audible alerts, audible communications from remote communication devices, and the like, at device 101. In particular, processor 120 is enabled to control speaker 132 to a given volume level and/or to a given tone and/or to a given message during a telephone call.

In some implementations, input device 128 and display 126 are external to device 101, with processor 120 in communication with each of input device 128 and display 126 via a suitable connection and/or link.

Processor 120 also connects to interface 124, which can be implemented as one or more radios and/or connectors and/or network adaptors, configured to wirelessly communicate with one or more communication networks (not depicted) via antenna 125. It will be appreciated that interface 124 is configured to correspond with network architecture that is used to implement one or more communication links to the one or more communication networks, including but not limited to any suitable combination of USB (universal serial bus) cables, serial cables, wireless links, cell-phone links, cellular network links (including but not limited to 2G, 2.5G, 3G, 4G+, UMTS (Universal Mobile Telecommunications System), CDMA (Code division multiple access), WCDMA (Wideband CDMA), FDD (frequency division duplexing), TDD (time division duplexing), TDD-LTE (TDD-Long Term Evolution), TD-SCDMA (Time Division Synchronous Code Division Multiple Access) and the like, wireless data, Bluetooth links, NFC (near field communication) links, WiFi links, WiMax links, packet based links, the Internet, analog networks, the PSTN (public switched telephone network), access points, and the like, and/or a combination.

Specifically, interface 124 comprises radio equipment (i.e. a radio transmitter and/or radio receiver) for receiving and transmitting signals using antenna 125. It is further appreciated that interface 124 can comprise a variable tuning circuit for tuning antenna 125, for example by matching impedance of antenna 125 to the radio equipment. The variable tuning circuit can hence comprise any suitable combination of capacitors and impedance coils (also referred to as inductors) for matching impedance of antenna 125 to the radio equipment of interface 124.

It is appreciated that processor 120 is generally enabled to determine a parameter associated with performance of antenna 125. The parameter can comprise one of or more of a reception parameter, a SAR parameter, an impedance parameter, a voice quality parameter, a VSWR (voltage standing wave ratio) parameter, a FER (frame error rate) parameter, an EVM (error vector magnitude) parameter, a BER (bit error rate) parameter, a bandwidth parameter, and a QoS (Quality of Service) parameter.

As such, device 101 can further comprise one or more detectors 137a, 137b (also referred to hereafter, generically, as a detector 137 and collectively as detectors 137) for measuring the parameter, including, but not limited to, one or more of a reception detector, a SAR detector, an impedance detector, a voice quality detector, a VSWR detector, an FER detector, an EVM detector, a BER detector, a bandwidth detector, and a QoS detector. It is further appreciated that detectors 137 can be implemented as a combination of hardware and software. For example, when one or more of detectors 137 comprise a BER detector, processor 120 can comprise one or more of detectors 137 implemented as software.

When implemented as hardware, one or more of detectors 137 can be a distinct component of device 101 and/or one or more of detectors 137 can be an element of interface 124.

For example, in some implementations, detector 137a can comprise a detector for detecting reception of antenna 125. In other implementations, detector 137a can comprise a SAR detector for detecting SAR proximal speaker 132. In other implementations, detector 137b, at interface 124, can comprise a SAR detector, as interface 124 is in communication with antenna 125 and can determine a level of radiation being received and/or transmitted by antenna 125.

In other implementations, detector 137a can comprise a detector for detecting voice quality at speaker 132; for example when antenna performance is low (i.e. when impedance matching is poor and/or radio signal quality is low) voice quality in a telephone call can be affected; for example, the volume can be reduced, noise can increase, and the like. Detector 137a, implemented as software, hardware and/or a combination thereof, can be enabled to determine voice quality. In some of these implementations, detector 137a comprises a digital signal processor (DSP) for determining voice quality.

It is yet further appreciated that interface 124 can comprise detector 137b which in turn comprises a measurement circuit for measuring reception at antenna 125. Hence, in yet further implementations, interface 124 can comprise a processor associated with one or more of radio equipment, a variable tuning circuit and detector 137b.

In other implementations, interface 124 can comprise detector 137b which in turn comprises a measurement circuit for measuring impedance of antenna 125, including but not limited to impedance mismatches between antenna 125 and radio equipment at interface 124. Detector 137b, when present, can comprise any suitable circuit for measuring reception and/or impedance of antenna 125, and can hence comprise any suitable combination of signal transmitter, signal receiver, capacitors and impedance coils for measuring reception and/or impedance of antenna 125. It is yet further appreciated that detector 137b can alternatively be enabled to determine radiation levels associated with antenna 125, and hence SAR can be determined.

In specific non-limiting implementations, device 101 can comprise a phone device, and antenna 125 comprises a main antenna, for example for communicating with a cell phone network.

Proximity sensor 133 can comprise any suitable proximity sensor, including, but not limited to, IR (infrared) diode/detectors, capacitive sensors, capacitive displacement sensors, Doppler effect sensors, eddy-current sensors, inductive sensors, laser sensors, optical sensors, acoustic sensors, magnetic sensors, passive optical sensors (such as charge-coupled devices), passive thermal infrared sensors, photocell sensors (reflective), magnetometers, gyroscopes, accelerometers, altimeters, and the like.

Further, proximity sensor 133 can be located at any position on device 101 for detecting one or more of a head of a user and a hand of a user to, in turn, determine when device 101 is in a head-hand mode. For example, proximity sensor 133 can be adjacent speaker 132 such that proximity sensor 133 detects proximity when a head of a user is adjacent speaker 132, as in FIG. 2. Alternatively, proximity sensor 133 can be positioned at device 101 to detect a hand of a user when user is holding device 101. In yet further implementations, proximity sensor 133 can comprise one or more proximity sensors for determining proximity adjacent speaker 132 and when device 101 is being held by a hand of a user. In other words, regardless of the location of proximity sensor 133, proximity sensor 133 is enabled to sense a head-hand mode of device 101.

It is further appreciated that such a head-hand mode can be indicated by virtue of determining proximity at proximity detector 133, and that processor 120 need not make a specific determination of a head-hand mode.

It is yet further appreciated that device 101 comprises a power source, not depicted, for example a battery or the like. In some implementations the power source can comprise a connection to a mains power supply and a power adaptor (e.g. and AC-to-DC (alternating current to direct current) adaptor).

In any event, it should be understood that a wide variety of configurations for device 101 are contemplated.

Figure 3:
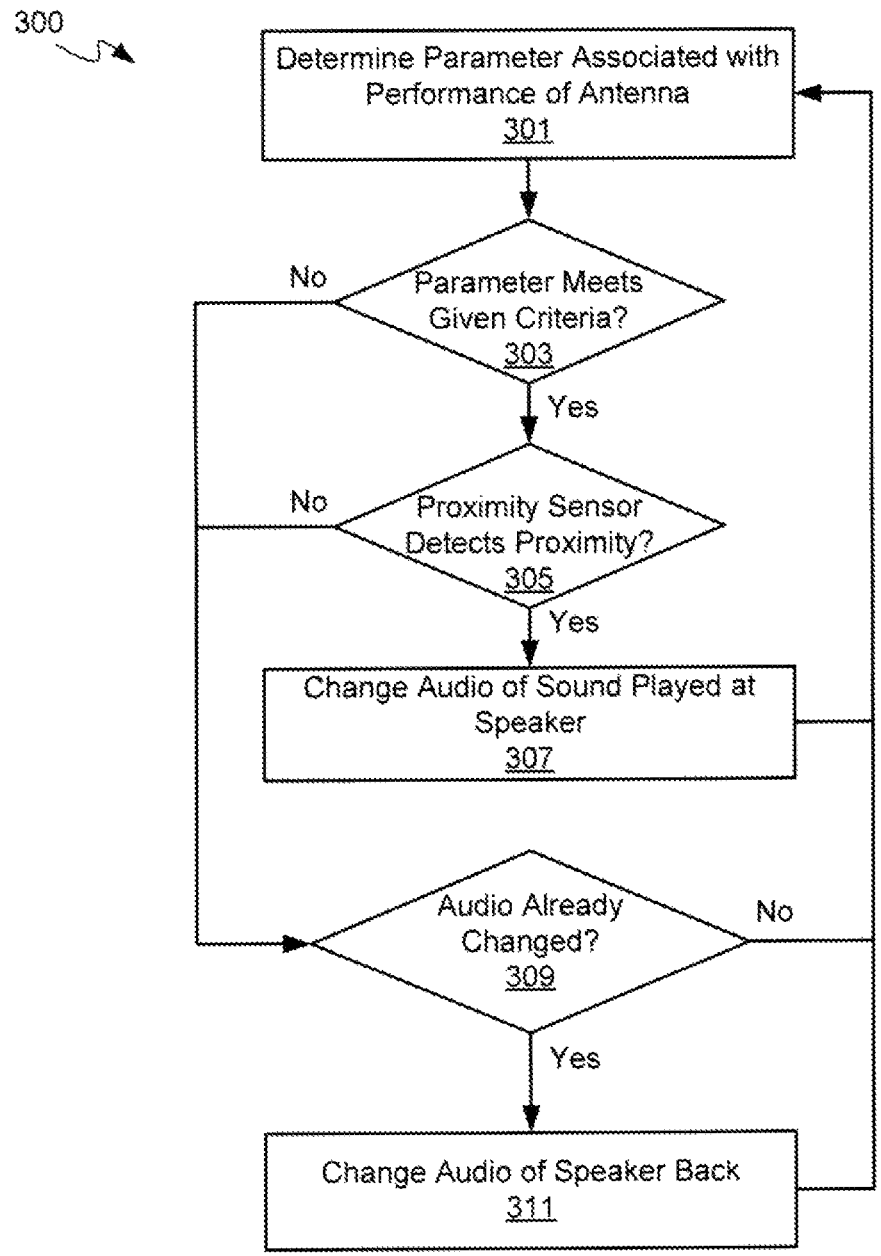
FIG. 3 depicts a flowchart of a method for antenna parameter notification, according to non-limiting implementations.

Hence attention is now directed to FIG. 3 which depicts a flowchart of a method 300 for antenna parameter notification, according to non-limiting implementations. In order to assist in the explanation of method 300, it will be assumed that method 300 is performed using device 101 to use speaker 132 for antenna parameter notification. Furthermore, the following discussion of method 300 will lead to a further understanding of device 101 and its various components. However, it is to be understood that device 101 and/or method 300 can be varied, and need not work exactly as discussed herein in conjunction with each other, and that such variations are within the scope of present implementations.

It is appreciated that, in some implementations, method 300 is implemented in device 101 by processor 120 processing application 140. Indeed, method 300 is one way in which device 101 can be configured. It is to be emphasized, however, that method 300 need not be performed in the exact sequence as shown, unless otherwise indicated; and likewise various blocks may be performed in parallel rather than in sequence; hence the elements of method 300 are referred to herein as "blocks" rather than "steps". It is also to be understood, however, that method 300 can be implemented on variations of device 101 as well. For example, in implementations where interface 124 comprises a processor and method 300 can be implemented at interface 124.

Figure 4:
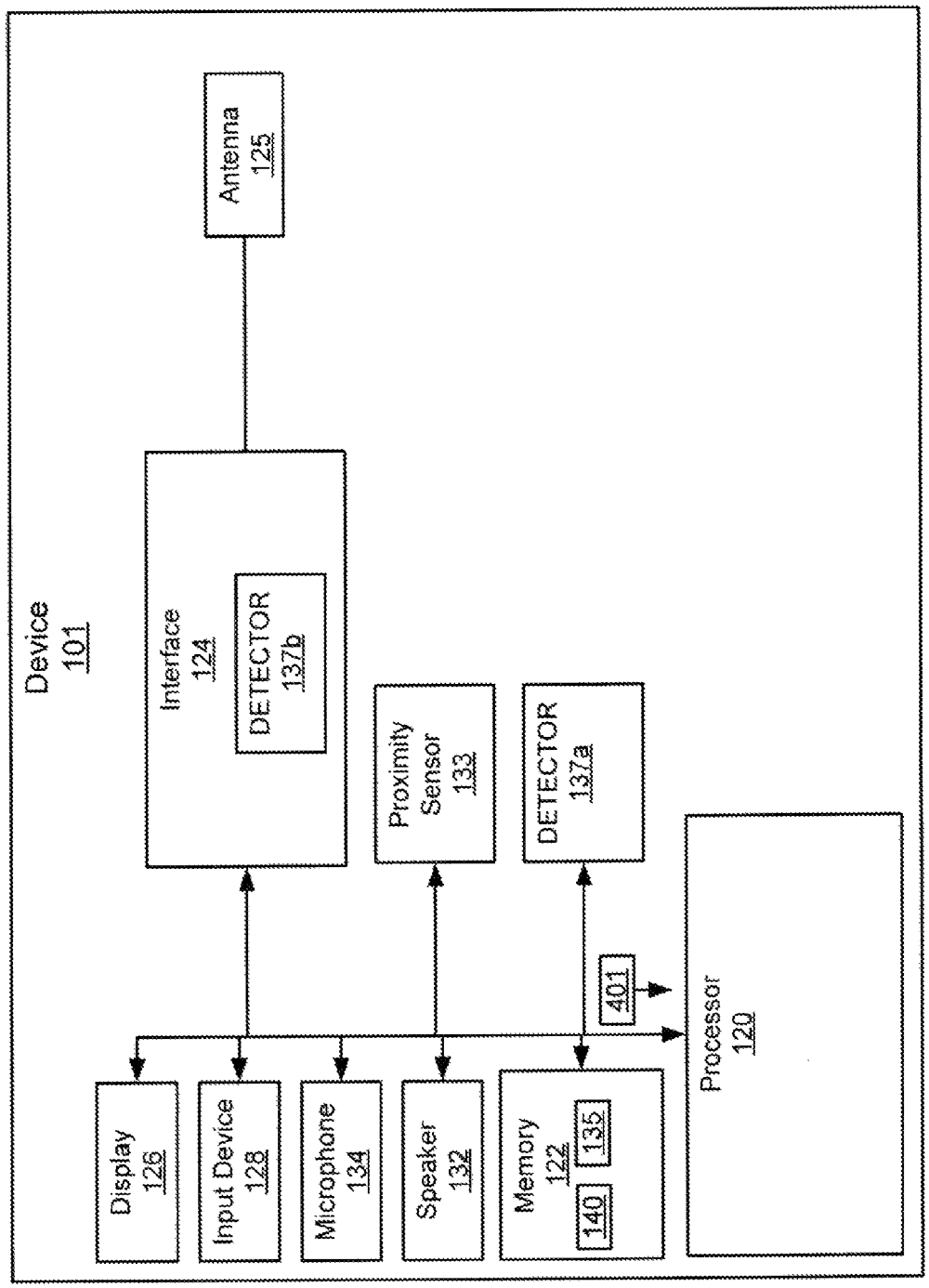
FIG. 4 depicts the device of FIG. 1 showing a determination of a parameter associated with antenna performance, according to non-limiting implementations.
Figure 5:
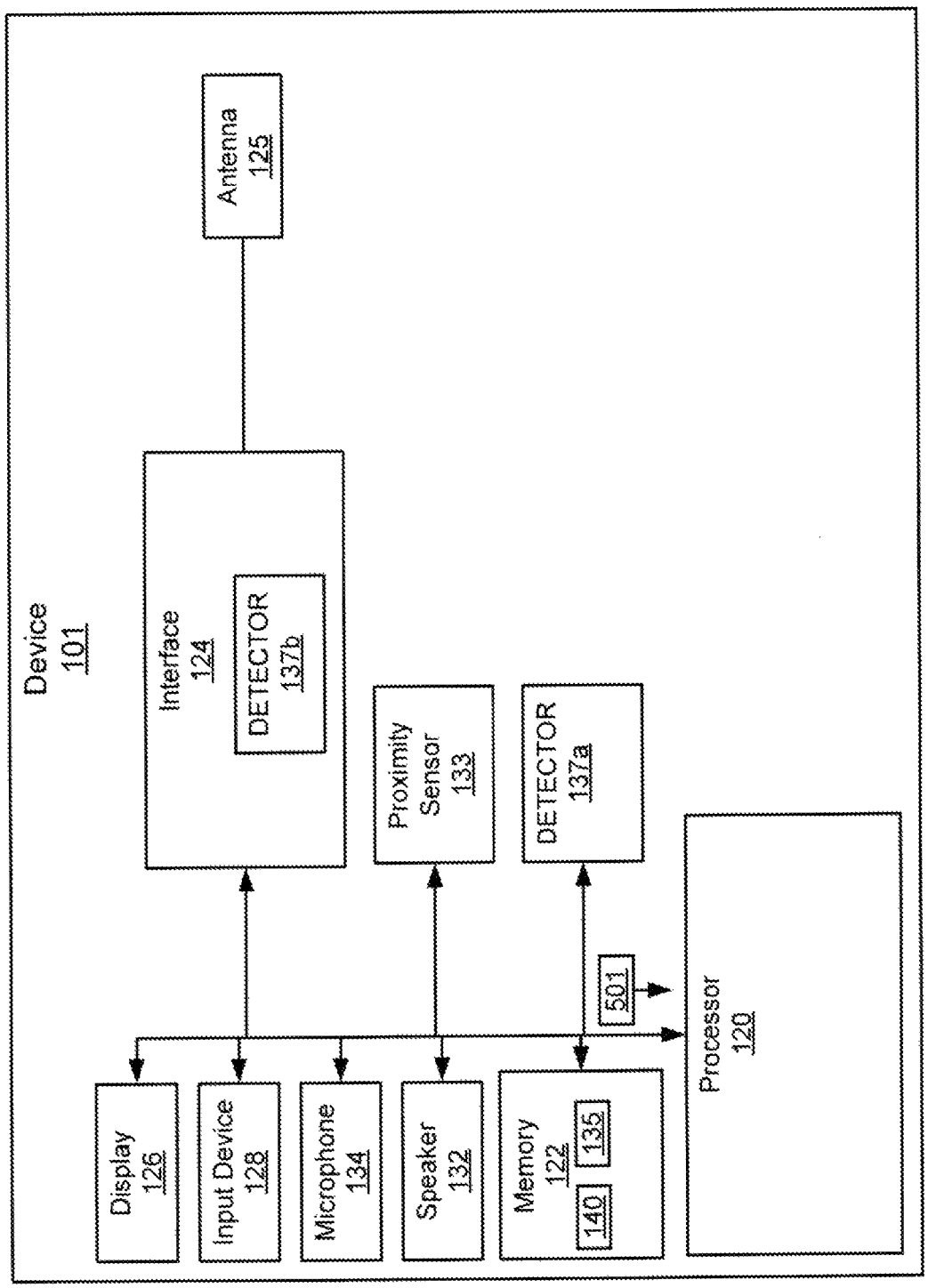
FIG. 5 depicts the device of FIG. 1 showing a determination of proximity, according to non-limiting implementations.
Figure 6:
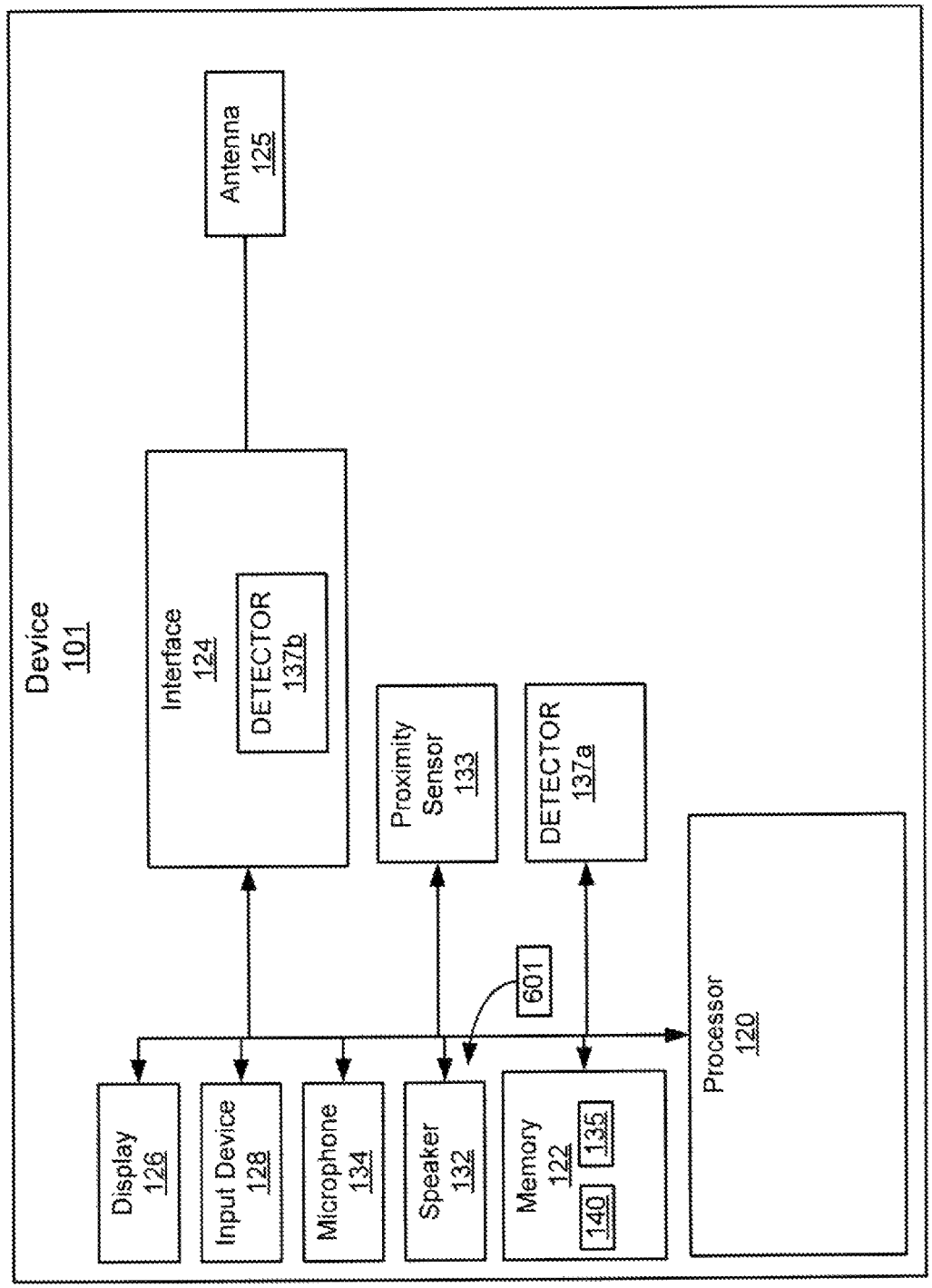
FIG. 6 depicts the device of FIG. 1 showing a processor changing audio at a speaker in response to the parameter meeting a given criteria and a determination of a proximity, according to non-limiting implementations.

Further, the following discussion of method 300 will be done with reference to FIGS. 4 to 6, each of which are similar to FIG. 1, with like elements having like numbers.

At block 301, processor 120 determines a parameter associated with performance of antenna 125. For example, processor 120 can communicate with one or more of detectors 137 and interface 124 to receive data 401 indicative of performance of antenna 125. The parameter can comprise one of or more of a SAR parameter, an impedance parameter, a voice quality parameter, a VSWR parameter, a FER parameter, an EVM parameter, a BER parameter, a bandwidth parameter, and a QoS parameter.

For example, in some implementations, the determined parameter can comprise a reception of antenna 125, for example as antenna 125 interacts with a communication network and hence data 401 is indicative of a reception level. In other implementations, the determined parameter can comprise a SAR level, and hence data 401 is indicative of SAR level. In other implementations, the parameter comprises an impedance of antenna 125, and hence data 401 is indicative of impedance of antenna 125, which in turn can be indicative of an impedance mismatch between antenna 125 and radio equipment at interface 124. In yet further implementations, the parameter comprises an indication of voice quality provided at speaker 132, and hence data 401 is indicative of voice quality at speaker 132. However, it is further appreciated that, in some implementations, the parameter can be determined by processor 120 without receipt of data 401. In other words, in implementations where processor 120 comprises detector 137a, processor 120 can determine the parameter associated with performance of antenna 125 without receipt of data 401.

It is further appreciated that in some implementations, at block 301, more than one parameter can be determined, for example more than one of the parameters described above.

At block 303, processor 120 compares the parameter to given criteria 135. When more than one parameter is determined, each parameter can be compared to respective given criteria 135. Either way, it is appreciated that given criteria 135 is commensurate with the parameter. Hence, when parameter comprises one or more of a reception parameter, a SAR parameter, an impedance parameter, a voice quality parameter, a VSWR parameter, a FER parameter, an EVM parameter, a BER parameter, a bandwidth parameter, and a QoS parameter, given criteria 135 respectively comprises one or more of a threshold reception level, threshold SAR level, one or more threshold impedance levels and/or a given range of acceptable impedance levels, one or more voice quality threshold levels, one or more VSWR thresholds, one or more FER thresholds, one or more EVM thresholds, one or more BER thresholds, one or more bandwidth thresholds, and one or more QoS thresholds.

For example, when the parameter comprises a reception of antenna 125, given criteria 135 comprises the reception being out of a given range thereby indicating poor reception at antenna 125. Similarly, when the parameter comprises a SAR level, given criteria 135 can comprise the SAR level exceeding a threshold SAR level, including but not limited to a predetermined threshold SAR level that is considered inappropriate exposure for human beings. When the parameter comprises an impedance of antenna 125, or the like, given criteria 135 can comprise the impedance being out of a given range of impedance, thereby indicating impedance mismatch between antenna 125 and associated radio equipment at interface 124. When the parameter comprises voice quality provided at speaker 132, given criteria 135 can comprise the voice quality being below a given voice quality threshold level.

In any event, at block 303, when the parameter does not meet given criteria 135 (i.e. a "No" decision at block 303), blocks 301 and 303 are repeated, presuming that audio of sound played at speaker 132 has not already been changed (i.e. block 307, described below, has not previously occurred) such that processor 120 is generally enabled to monitor one or more parameters associated with performance of antenna 125. In implementations where more than one parameter is compared to respective criteria 135, memory 122 can store rules for determining priority of the parameters such that when some of parameters do not meet respective given criteria 135, while other parameters do meet respective given criteria 135, a "No" decision is reached at block 303. For example, a SAR level parameter exceeding a threshold SAR level can be given priority over reception of antenna 125 being acceptable.

However, at block 303 when the parameter does meet given criteria 135 (i.e. a "Yes" decision at block 303), at block 305 processor 120 determines whether proximity sensor 133 has detected proximity, for example due to proximity of head and/or a hand of a user. As such, proximity sensor 133 senses a head-hand mode of device 101.

It is further appreciated that blocks 301 to 305 can be implemented in any suitable order and/or in parallel with each other. For example, proximity can first be detected at block 305 before and/or while the parameter is determined at block 301.

Attention is next directed to FIG. 5 to illustrate a non-limiting implementation of block 305, where processor 120 communicates with proximity sensor 133 to receive proximity data 501 from proximity sensor 133, proximity data 501 indicative of detected proximity at proximity sensor 133. Proximity data 501 can be processed by processor 120 to determine whether proximity has been detected, or not, at proximity sensor 133.

In any event, at block 305 when processor 120 determines that proximity has not been detected at proximity sensor 133 (i.e. a "No" decision at block 305), blocks 301 to 305 are repeated, presuming that audio of sound played at speaker 132 has not already been changed (i.e. block 307, described below, has not previously occurred), such that processor 120 is generally enabled to monitor one or more parameters associated with performance of antenna 125 and when the one or more parameters meets given criteria 135 again determine whether proximity sensor 133 has detected proximity.

However, at block 305, when processor 120 determines that proximity has been detected at proximity sensor 133 (i.e. a "Yes" decision at block 305), at block 307, processor 120 changes audio of sound played at speaker 132. For example, attention is directed to FIG. 6 where processor 120 controls speaker 132 to change the audio via a command and/or signal 601.

Either way, such a change in audio of sound played at speaker 132 is indicative that a parameter associated with performance of antenna 125 has met given criteria 135, and further indicative that the performance of antenna 125 is poor. As a result, the change in audio of sound played at speaker 132 can serve as a prompt to a user to adjust device 101 to improve performance of antenna 125, for example by adjusting a position of device 101.

For example, in some implementations, the volume of speaker 132 can be increased or decreased at block 307. In some of these implementations, the volume of speaker 132 is changed to a given volume level that can be stored at memory 122. In some of these implementations, the volume is increased to a given volume that is predetermined to cause discomfort in a human being when speaker 132 is adjacent an ear of the human being. For example, attention is directed to FIG. 7, which is substantially similar to FIG. 2, with like elements having like numbers. In FIG. 7, user 200 has moved device 101 away from ear 203 as volume of sound 701 from speaker 132 has increased to level predetermined to cause discomfort at user 200; for example, the given volume can be at about 80 dB or above about 80 dB. It is further appreciated that the given volume of a given frequency range of sound can be controlled, for example sound within a hearing range of a human being, for example with a range of about 20 Hz to about 20 kHz.

In particular, the volume of speaker 132 can be increased to a volume level predetermined to cause discomfort in human beings when the parameter and given criteria 135 are related to SAR levels such that user 200 is caused to position device 101 away from his/her head when SAR levels are above a given SAR threshold level. Hence, in these implementations, when SAR levels are above a given SAR threshold level, the volume of speaker 132 is raised to a level that is uncomfortable for a human being to encourage the user to take device 101 away from his/her ear and hence reduce SAR levels.

In other implementations, the volume of speaker 132 is decreased to a volume where an average human being will have trouble hearing a voice to encourage the user to move device 101 to increase the volume.

In yet further implementation, at block 307, changing the audio of sound played at speaker 132 comprises changing a tone played at speaker 132: for example a given tone can be played at speaker 132 when "Yes" decisions occur at blocks 303, 305, such as a high pitched whine, a low frequency sound, and the like. In yet further implementations, at block 307, changing the audio of sound played at speaker 132 comprises changing and/or playing a message at speaker 132: for example a given message can be played at speaker 132 when "Yes" decisions occur at blocks 303, 305, such as "SAR level is too high in this position", "Reception of antenna is poor in this position" and the like.

In yet further implementations, any suitable combination of volume, tone and or messages can be changed at block 307.

In any event, and again returning to FIG. 3, at block 307 processor 120 changes audio of sound played at speaker 132, for example to a given volume and/or tone and/or message. The change in audio can be sudden, for example as a step-function, or the change in audio can be gradual, for example a linear or exponential change over a given time period, such as about 5 seconds or the like.

In yet further implementations, at block 307, processor 120 changes audio of sound played at speaker 132 as a function of one or more of the parameters, for example according to a function $A=F(P)$, where A is one or more changeable audio properties of speaker 132, F is a suitable function and P is one or more of the parameters. Hence, audio of speaker 132 varies according to the one or more parameters. In some implementations, the function F can comprise a linear function, while in other implementations, the function F can comprise an exponential function. In yet further implementations, the function F can be non-linear, for example a function of two or more of the parameters, such as $A=F(P1, P2, P3 \ldots Pn)$, where each of $P1, P2, P3 \ldots Pn$ is a different one of the parameters: further while four parameters are shown function F can be dependent on any number of the parameters. It is further appreciated that, in some implementations, audio A of function $A=F(P)$ can be expressed in terms of an electrical parameter of speaker 132. For example, audio changes can be related to one or more of a current and a voltage supplied to speaker 132, and hence audio A can be correspondingly expressed as a current and a voltage supplied to speaker 132.

In any event, once audio of sound played at speaker 132 is changed at block 307, blocks 301 to 305 occur again. When block 307 is reached again, the audio of sound played at speaker 132 can again be changed. Alternatively, when the audio of sound played at speaker 132 has already been changed, no further changes occur.

However, when a "No" decision is reached at one or more of block 303 and block 305, at block 309 processor 120 determines whether block 307 has been previously implemented, i.e. to determine when audio of sound played at speaker 132 has already been changed. If so (i.e. a "Yes" decision at block 309, and processor 120 has already changed the audio of sound played at speaker 132 at block 307), at block 311, the audio of sound played at speaker 132 is changed back to how it was before block 307 occurred. Blocks 301 to 305 then reoccur until "Yes" decisions occur again at blocks 303 and 305. It is further appreciated that the audio of sound played at speaker 132 can be changed at block 311 according to the function $A=F(P)$ described above.

It is further appreciated that method 300 can be implemented as a feedback loop. In other words, processor 120 can be enabled to monitor the parameter and change (i.e. increase and/or decrease volume and/or change a tone and/or change a message) the audio of sound played at speaker 132 in a feedback loop with the parameter, such that as the parameter changes, the audio of sound played at speaker 132 changes, for example according to the function $A=F(P)$ described above. Hence, when a user hears a change in the audio of sound played at speaker 132, the user can react by moving device 101 until the user hears audio of sound played at speaker 132 change again. The user can hence position device 101 until the audio of sound played at speaker 132 is stable, and hence the parameter is also stable.

In some implementations at least a portion of device 101 is flexible, and the parameter can be affected by the shape of device. 101. In these implementations, the processor 120 can be enabled to change the audio of sound played at speaker 132 as a shape of device 101 changes, which in turn causes the monitored parameter associated with performance of antenna 125 to change.

In this manner, audio of sound played at speaker 132 can be controlled by processor 120 to reflect a poor performance of antenna 125, which in turn can cause a user to take action to improve the performance of antenna 125 by moving device 101.

Further, increasing the volume of speaker 132 can increased to a discomforting level when SAR levels are high (i.e. above a given threshold value), to cause a user to take device 101 away from their face to reduce radiation exposure. Therefore, method 300 can be implemented as method of improving safety of device 101.

Those skilled in the art will appreciate that in some implementations, the functionality of device 101 can be implemented using pre-programmed hardware or firmware elements (e.g., application specific integrated circuits (ASICs), electrically erasable programmable read-only memories (EEPROMs), etc.), or other related components. In other implementations, the functionality of device 101 can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

A portion of the disclosure of this patent document contains material which is subject to copyright protection. The copyright owner has no objection to the facsimile reproduction by any one of the patent document or patent disclosure, as it appears in the Patent and Trademark Office patent file or records, but otherwise reserves all copyrights whatsoever.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A device comprising:
   at least one processor, an antenna, a proximity sensor and a speaker, the at least one processor configured to:
   determine a parameter associated with performance of the antenna, the parameter comprising an impedance of the antenna;
   when the parameter meets a given criteria, and when the proximity sensor detects proximity, then change audio of sound played at the speaker, the given criteria comprising the impedance being out of a given range thereby indicating impedance mismatch between the antenna and associated radio equipment; and, change a volume of the speaker as a function of the parameter, such that change in the volume of the speaker varies according to the parameter.

2. The device of claim 1, wherein the parameter further comprises a SAR (specific absorption rate) level, and the given criteria correspondingly further comprises the SAR level exceeding a threshold SAR level.

3. The device of claim 1, wherein the parameter further comprises voice quality provided at the speaker, and the given criteria correspondingly further comprises the voice quality being below a given voice quality threshold level.

4. The device of claim 1, wherein the proximity sensor comprises one or more of an IR (infrared) diode/detector combination, a capacitive sensor, a capacitive displacement sensor, a Doppler effect sensor, a laser sensor, an optical sensor, an acoustic sensor, a passive optical sensor, a charge-coupled device, a passive thermal infrared sensor, a photocell sensor, a magnetometer, a gyroscope, an accelerometer, and an altimeter.

5. The device of claim 1, wherein the proximity sensor is located adjacent the speaker, such that the proximity sensor can sense a head-hand mode of the device.

6. The device of claim 1, wherein the audio of the sound played at the speaker is changed to a given volume predetermined to cause discomfort to a human being when the speaker is adjacent an ear of the human being.

7. The device of claim 1, wherein the processor is further configured to change one or more of a tone and a message played at the speaker as a function of the parameter, such that change in the one or more of the tone and the message varies according to the parameter.

8. The device of claim 1, wherein the processor is further configured to monitor the parameter and change the audio of the sound played at the speaker in a feedback loop with the parameter.

9. The device of claim 1, wherein at least a portion of the device is flexible and the processor is further configured to change the audio of the sound played at the speaker as a shape of the device changes.

10. A method comprising:
    at a device comprising at least one processor, an antenna, a proximity sensor and a speaker, determining, at the processor, a parameter associated with performance of the antenna, the parameter comprising an impedance of the antenna;
    when the parameter meets a given criteria, and when the proximity sensor detects proximity, then changing audio of sound played at the speaker, the given criteria comprising the impedance being out of a given range thereby indicating impedance mismatch between the antenna and associated radio equipment; and, comprising changing a volume of the speaker as a function of the parameter, such that change in the volume of the speaker varies according to the parameter.

11. The method of claim 10, wherein the parameter further comprises a SAR (specific absorption rate) level, and the given criteria correspondingly further comprises the SAR level exceeding a threshold SAR level.

12. The method of claim 10, wherein the parameter further comprises voice quality provided at the speaker, and the given criteria correspondingly further comprises the voice quality being below a given voice quality threshold level.

13. The method of claim 10, wherein the audio of the sound played at the speaker is changed to a given volume predetermined to cause discomfort to a human being when the speaker is adjacent an ear of the human being.

14. The method of claim 10, further comprising changing one or more of a tone and a message played at the speaker as a function of the parameter, such that change in the one or more of the tone and the message varies according to the parameter.

15. The method of claim 10, further comprising monitoring the parameter and changing the audio of the sound played at the speaker in a feedback loop with the parameter.

16. The method of claim 10, wherein at least a portion of the device is flexible and the method further comprises changing the audio of the sound played at the speaker as a shape of the device changes.

17. A non-transitory computer readable medium storing a computer program, wherein execution of the computer program is for:

at a device comprising at least one processor, an antenna, a proximity sensor and a speaker, determining, at the processor, a parameter associated with performance of the antenna, the parameter comprising an impedance of the antenna;

when the parameter meets a given criteria, and when the proximity sensor detects proximity, then changing audio of sound played at the speaker, the given criteria comprising the impedance being out of a given range thereby indicating impedance mismatch between the antenna and associated radio equipment; and, comprising changing a volume of the speaker as a function of the parameter, such that change in the volume of the speaker varies according to the parameter.

\* \* \* \* \*